United States Patent [19]
Shipley et al.

[11] Patent Number: 6,110,294
[45] Date of Patent: Aug. 29, 2000

[54] APPARATUS AND METHOD FOR CLEANING SEMICONDUCTOR WAFER

[75] Inventors: Kevin D. Shipley, Katy, Tex.; Peter A. Burke, Avondale, Pa.

[73] Assignee: Advanced Micro Devices, Inc., Sunnyvale, Calif.

[21] Appl. No.: 09/060,521

[22] Filed: Apr. 14, 1998

Related U.S. Application Data

[63] Continuation-in-part of application No. 08/944,248, Oct. 6, 1997, Pat. No. 5,966,766.

[51] Int. Cl.⁷ .............................. B08B 1/04; B08B 11/00
[52] U.S. Cl. .................................. 134/6; 15/72; 15/102; 134/1.3
[58] Field of Search .................. 15/50.1, 77, 98, 15/102; 134/1.3, 2, 6

[56] References Cited

U.S. PATENT DOCUMENTS

| | | |
|---|---|---|
| 1,929,345 | 10/1933 | Brown et al. . |
| 3,034,625 | 5/1962 | Grote . |
| 3,946,454 | 3/1976 | Holm et al. .................. 15/77 |
| 4,322,920 | 4/1982 | Wells . |
| 4,523,411 | 6/1985 | Freerks . |
| 4,811,443 | 3/1989 | Nishizawa . |
| 5,146,643 | 9/1992 | Bojar et al. . |
| 5,185,964 | 2/1993 | Englund et al. . |
| 5,320,706 | 6/1994 | Blackwell . |
| 5,361,449 | 11/1994 | Akimoto . |
| 5,495,632 | 3/1996 | Baker . |
| 5,498,199 | 3/1996 | Karlsrud et al. . |
| 5,597,443 | 1/1997 | Hempel . |
| 5,616,069 | 4/1997 | Walker et al. . |
| 5,685,039 | 11/1997 | Hamada et al. ............. 15/102 |
| 5,778,481 | 7/1998 | Amsden et al. ............. 15/102 |
| 5,806,126 | 9/1998 | De Larios et al. ........... 15/102 |
| 5,826,292 | 10/1998 | Ikemoto ....................... 15/77 |
| 5,868,863 | 2/1999 | Hymes et al. ................ 134/6 |
| 5,870,793 | 2/1999 | Choffat et al. . |

FOREIGN PATENT DOCUMENTS

| | | |
|---|---|---|
| 1112815 | 8/1961 | Germany ..................... 15/50.1 |
| 416055 | 9/1934 | United Kingdom . |
| WO 85/02869 | 7/1985 | WIPO ............................ 134/2 |

OTHER PUBLICATIONS

Patent Abstracts of Japan 08318226, published Dec. 3, 1996 (with attached Japanese language patent), 4 sheets.
Patent Abstracts of Japan 08241880, published Sep. 17, 1996, (with attached Japanese language patent), 5 sheets.
Bostik Product Data, "7119M: Liquid Adhesives," published Oct. 1994, 2 sheets.

*Primary Examiner*—Terrence R. Till
*Attorney, Agent, or Firm*—Conley, Rose & Tayon, P.C.; Robert C. Kowert

[57] ABSTRACT

A method and apparatus for cleaning a semiconductor wafer. The apparatus preferably includes a brush holder that may include a base and a connection stud extending from the base. The base preferably includes a receiving lip for receiving a brush that is disposed on its lower surface. The brush preferably includes a substantially flexible material and a plurality of protrusions for contacting a semiconductor wafer. A backing plate preferably is attached to one side of the brush for connecting the brush to the brush holder. The backing plate preferably further includes an outer edge capable of forming a snap-fit engagement within the receiving lip of the brush holder to: (a) facilitate periodic replacement of the brush and (b) form a mechanical connection between the brush and brush holder that can withstand the presence of relatively basic or acidic cleaning agents. A rotatable shaft is connected to the connection stud. The rotatable shaft includes a conduit running through the shaft for flowing cleaning fluid through a borehole in the connection stud and brush holder and through an opening in the backing plate and brush so that cleaning fluid may be directly dispensed through the shaft conduit to the wafer. This cleaning fluid disbursement technique improves cleaning and prevents particles from being left behind as the brush is removed from the wafer.

28 Claims, 7 Drawing Sheets

APPARATUS AND METHOD FOR CLEANING SEMICONDUCTOR WAFER

This application is a continuation-in-part of U.S. Ser. No. 08/944,248, filed Oct. 6, 1997 now U.S. Pat. No. 5,966,766.

BACKGROUND OF THE INVENTION

1. Field of the Invention

The present invention generally relates to method and apparatus for cleaning a semiconductor wafer, and more particularly, an embodiment of the invention relates to a brush assembly for removing slurry particles from a semiconductor wafer.

2. Description of the Related Art

Integrated circuit fabrication typically includes a process step of creating an extremely flat surface on a surface of a semiconductor wafer. Chemical-Mechanical Polishing (CMP) is a known technique for planarizing the surface of a semiconductor wafer to a desired thickness. CMP typically involves contacting a polishing pad against the wafer and rotating the polishing pad with respect to the wafer. A slurry containing abrasive particles is typically applied to the surface of the wafer to facilitate mechanical polishing of the wafer. The slurry may also contain a chemical agent to increase the rate that material is removed from the wafer. After the wafer is treated in a CMP process, it may be scrubbed to clean the wafer surface of any remaining slurry particles. The wafer may be contacted with water to remove the slurry particles.

In one process, a brush assembly that includes a brush attached to a brush holder is used to clean a semiconductor wafer after a CMP process. The brush includes a backing plate comprising a plurality of holes disposed about the edges of the backing plate. The brush includes a surface for contacting the wafer located on a side opposite the backing plate. Water is passed through the openings in the backing plate to the portion of the brush that contacts the wafer surface during cleaning. The brush is connected to brush holder via a double-sided adhesive coupon placed between the backing plate and brush holder.

The brushes used in the above-described system need to be periodically replaced. Such replacement tends to be difficult and time-consuming. The old brush and the adhesive coupon must first be removed from brush holder. Removal of adhesive residue left by the adhesive coupon tends to be difficult, and acetone or another chemical often must be applied to brush holder to facilitate removal of the adhesive residue. Once the old brush and adhesive coupon are removed, a new double-sided adhesive coupon is placed on the brush holder. Backing paper usually must be peeled from both sides of the adhesive coupon to expose its adhesive surfaces. Occasionally, the adhesive coupon tears when the backing paper is peeled away. The adhesive coupon contains a number of openings arranged to match a pattern of openings on the brush holder and the backing plate of the brush. It tends to be difficult to position the adhesive coupon on the backing plate and/or brush holder such that the openings in the backing plate, brush holder, and adhesive coupon are properly aligned. In addition, the adhesive coupon may be incompatible with cleaning agents (e.g., ammonium hydroxide) that reduce or eliminate the adhesive capability of the adhesive coupon.

The brushes are typically replaced by operators who must wear latex gloves, which increases the difficulty and time required to: (a) remove the backing paper from the adhesive coupon without tearing the coupon, and (b) properly position the adhesive coupon on both the backing plate and the brush holder such that the patterns of openings are aligned in each of the three components. An operator typically spends about 2–4 hours to replace 6 of the brushes.

Another problem with some wafer brushes involves the application of cleaning fluid to the brush and wafer. The brush is usually made from a flexible, porous sponge-like material. One side of the brush is designed to contact the surface of a semiconductor wafer. The other side of the brush it is attached to a backing plate. The backing plate may include a plurality of holes opened to the upper surface of the sponge-like brush. A cleaning fluid may be applied to the top of the backing plate in order to pass through these holes and soak into the brush and onto the surface of the semiconductor wafer. If the cleaning fluid is applied while the brush is rotating, much of the cleaning fluid flies off of the brush backing plate instead of flowing into the holes and soaking through the brush. Therefore, it may be necessary to stop rotation of the brush to apply the cleaning fluid or to change the cleaning fluid composition and then restart brush rotation.

Often it is desirable to change or cycle the composition of the cleaning fluid from one fluid to another or to introduce different chemicals into the cleaning fluid. To avoid the fluid from flying off the brush and to allow the fluid to soak into the brush and reach the wafer, brush rotation may need to be stopped each time the cleaning fluid is changed or cycled. This starting and stopping of brush rotation decreases the overall throughput of the wafer cleaning process. Furthermore, the cleaning fluid cannot be applied to the wafer at a very fast rate. The rate which cleaning fluid may be applied to the wafer is limited to the amount of cleaning fluid that can pass through the backing plate openings and soak through the sponge-like brush. In some circumstances a greater flow rate of cleaning fluid may be desirable.

Yet another problem results when the wafer brush is removed from the surface of the semiconductor wafer. Particles may become trapped in the porous holes within the lower surface of the sponge-like brush. The flow rate of cleaning fluid passing through the brush may not be great enough to dislodge these particles. As the brush is lifted from the surface of the semiconductor wafer, surface tension between the cleaning fluid on the surface of the wafer and the sponge pores may cause those particles to be sucked from the brush and left upon the surface of the semiconductor wafer. This results in an undesirable amount of particles being left on the surface of the wafer, thus requiring additional cleansing steps to remove the particles.

It is therefore desirable that an improved brush assembly be derived for cleaning a semiconductor wafer.

SUMMARY OF THE INVENTION

In accordance with the present invention, a brush assembly is provided that largely eliminates or reduces the aforementioned disadvantages of certain conventional semiconductor wafer cleaning brushes. An embodiment of the invention relates to a brush assembly for cleaning a semiconductor wafer that includes a brush holder, a brush, a backing plate, and a hollow rotation shaft.

The brush holder preferably includes a base and a connection stud extending from the base. The connection stud preferably includes a slot for attaching the brush holder to a scrubber of a polishing device. The connection stud may be connected to a hollow shaft that is adapted to deliver cleaning fluid to the brush. The connection stud may include one or more openings for distributing cleaning fluid from the polishing device to the upper surface of the base. The base preferably includes a receiving lip on its lower surface for forming a fixable engagement with a brush. The base preferably further includes a plurality of openings for passing cleaning solution from the brush holder to the surface of the brush.

The brush is preferably substantially circular in shape and preferably includes a substantially flexible material for contacting the semiconductor wafer. A plurality of protrusions may be formed in the substantially flexible material. The protrusions may be substantially compressible. The brush may contain a central opening in the flexible material for facilitating the dispersal of cleaning fluid directly onto the semiconductor wafer.

A backing plate is preferably attached to one side of the brush and may serve to connect the brush to the brush holder. The backing plate preferably includes a plurality of openings arranged to match the pattern of openings on the base of the brush holder. The backing plate preferably includes an outer edge that is shaped and sized to form a snap-fit engagement within the receiving lip of the brush holder when the brush and brush holder are pressed together. The backing plate may include an alignment portion extending from its edge that is sized to fit within an aperture formed in the receiving lip of the brush holder. Placing the alignment portion within the aperture preferably causes the openings on the brush holder and the openings on the backing plate to be properly aligned. When the brush is secured within the brush holder, force may be applied to the alignment portion to remove the brush from the brush holder. The backing plate may include an opening that communicates with an axial borehole of the connection stud, the brush may include a central opening in its flexible material that communicates with the axial borehole of the connection stud 12 through the opening in the backing plate. The backing plate may include a raised lip on its upper surface for containing a predetermined volume of cleaning fluid on the upper surface of the base.

One embodiment of the present invention includes a brush holder having a base and a connection stud extending from the upper surface of the base. A brush is attached to the lower surface of the base. The brush may include substantially flexible material adapted for contacting the surface of the semiconductor wafer. A shaft having a conduit formed lengthwise within the shaft is attached at one end to the connection stud. The other end of the shaft is attached to a scrubber device for causing the shaft, and thus the brush, to rotate. The conduit within the shaft is adapted for delivering cleaning fluid to the brush. The upper end of the shaft is connected to the scrubber device. It also may be connected with a cleaning fluid dispensing device for dispensing cleaning fluid through the conduit. The other end of the shaft may communicate with a bore hole within the connection stud to allow cleaning fluid to pass through to the brush. The backing plate may include an opening in alignment with the bore hole to allow cleaning fluid to pass through to the brush. The brush may also include an opening in alignment with this backing plate opening. This backing plate opening, bore hole, and conduit allow cleaning fluid to be directly dispersed onto the wafer. The conduit, bore hole, and openings may be adapted so that cleaning fluid may be dispersed onto the surface of the wafer at a certain pressure and then sprayed onto the surface of the wafer as the brush is lifted from the wafer. Applying cleaning fluid in this manner may served to break the surface tension between the brush and the wafer as the brush is lifted from the wafer, thus preventing particles from been sucked from the brush pores and left on the surface of the wafer. Furthermore the ability to spray cleaning fluid through the shaft and opening onto the surface of the wafer as the brush is lifted may serve to further clean the wafer and remove particles.

Moreover, the conduit and aligned openings in the brush and backing plate form a direct passage that allows cleaning fluid to be directly dispensed to the surface of the wafer during cleaning. Therefore, instead of a slow soak-through drip process for distributing cleaning fluid through the brush and onto the wafer, the present invention allows a much faster distribution of cleaning fluid to be performed by passing cleaning fluid directly through the conduit and the shaft to the openings in the backing plate and brush and directly to the wafer. This improved flow of cleaning fluid increases the rate at which particles are washed off the wafer during polishing, thus keeping particles from becoming lodged within the pores of the brush. Furthermore, the direct passage for distributing clean fluid allows the composition of the cleaning fluid to be changed, or the flow rate of cleaning fluid to be changed, without stopping brush rotation. With some prior art brushes, the rate which the composition of cleaning fluid could be changed was limited by the fact that the cleaning fluid had to soak through the brush to be distributed. Thus, an instantaneous change in the composition of cleaning fluid was not possible. However, the present invention allows an instantaneous change in the composition of the cleaning fluid, such as from ammonium hydroxide to water. Also the change in the cleaning fluid may be made without stopping the rotation of the brush. Furthermore, the pressure at which the cleaning fluid is applied to the wafer, or the flow rate at which the cleaning fluid is applied to the wafer, may easily be changed with the present invention and without stopping brush rotation. Whereas with conventional wafer brushes, the flow rate of cleaning fluid was limited to the rate at which cleaning fluid could soak through the brush.

Generally speaking, the present invention contemplates an apparatus for cleaning a semiconductor wafer including a brush holder having a base and a connection stud extending from the upper surface of the base. The brush may be attached to the lower surface of the base. The brush may comprise a substantially flexible material for contacting the surface of a semiconductor wafer. A shaft with a conduit formed therein is coupled at an upper end of the shaft to a scrubber device for rotating the shaft and is coupled to the connection stud at the lower end of the shaft. The conduit within the shaft is adapted for delivering a cleaning fluid to the brush. The connection stud includes a borehole adapted to communicate with the shaft and to deliver the cleaning fluid to the brush. The base and the brush may each include an opening adapted to communicate with the borehole and with the conduit for delivering the cleaning fluid to the surface of the wafer. The conduit, borehole and openings may also be adapted to spray cleaning fluid on the semiconductor wafer as the brush is lifted from the wafer. The cleaning fluid may include ammonium hydroxide or water. The connection stud may also have a slot. The shaft may have an opening at its lower end adapted to receive a pin for forming at a snap-fit engagement with the slot in the connection stud. The pin may have a smaller diameter at its middle than at its ends to facilitate the passage of cleaning fluid through the conduit and the borehole. The brush may be attached to a backing plate and the lower surface of the brush holder may include a receiving what adapted to form a snap-fit engagement with the outer edge of the backing plate.

Another embodiment of the present invention contemplates an apparatus for cleaning a semiconductor wafer including a scrubber having rotating means. The shaft is coupled to a scrubber at the upper end of the shaft and the shaft includes a conduit disposed axially within the shaft. The brush assembly is coupled to the lower end of the shaft and the rotating means is operable to rotate the shaft and the brush assembly. The conduit is adapted to dispense cleaning fluid to the brush assembly and/or to the wafer. The brush assembly may include an opening communicating with the conduit for dispensing the cleaning fluid to the surface of the semiconductor wafer. The brush may be attached to a backing plate and the brush holder may have a receiving lip on its lower surface adapted to form a snap-fit connection with the backing plate.

The present invention also includes a method for cleaning a semiconductor wafer. The method comprises rotating a shaft connected to brush to rotate the brush. The rotating brush and a cleaning fluid are applied to the surface of the semiconductor wafer for cleaning the surface of the semiconductor wafer. Upon completion of the cleaning, cleaning fluid is directed through a conduit in the shaft and through an opening in the center of the brush to the surface of the semiconductor wafer. The brush is then lifted from the surface of the semiconductor wafer as cleaning fluid is directed onto the surface of the semiconductor wafer. Then cleaning fluid may be sprayed upon the surface of the semiconductor wafer during and after the lifting by passing cleaning fluid through the conduit and the opening. During the cleaning when the brush is applied to the surface of the wafer, cleaning fluid may be passed through the conduit and openings to the surface of the wafer. Furthermore the composition of the cleaning fluid may be changed during the cleaning without stopping rotation of the brush. For example, the cleaning fluid composition may be changed from ammonium hydroxide to water or from water to ammonium hydroxide. The method of the present invention also contemplates replacing the brush by releasing a backing plate from a snap-fit engagement with a brush holder and inserting a new brush and the backing plate into the snap-fit engagement with the brush holder.

An advantage of the invention relates to a brush assembly for cleaning a semiconductor wafer that includes components that are able to be quickly and easily assembled by an operator onsite.

Another advantage of the invention relates to a brush assembly configured to distribute cleaning fluid onto the surface of a brush in a manner to increase the rate of particle removal on a semiconductor wafer.

Yet another advantage of the invention relates to a brush assembly configured to inhibit particles from being transferred from a brush to a semiconductor wafer when the brush is removed from the semiconductor wafer.

Still another advantage of the invention relates to a brush assembly for cleaning a semiconductor wafer that includes a brush and brush holder in a mechanical engagement that can withstand the presence of relatively acidic or basic cleaning agents.

BRIEF DESCRIPTION OF THE DRAWINGS

Further advantages of the present invention will become apparent to those skilled in the art with the benefit of the following detailed description of the preferred embodiments and upon reference to the accompanying drawings in which.

Figure 1:
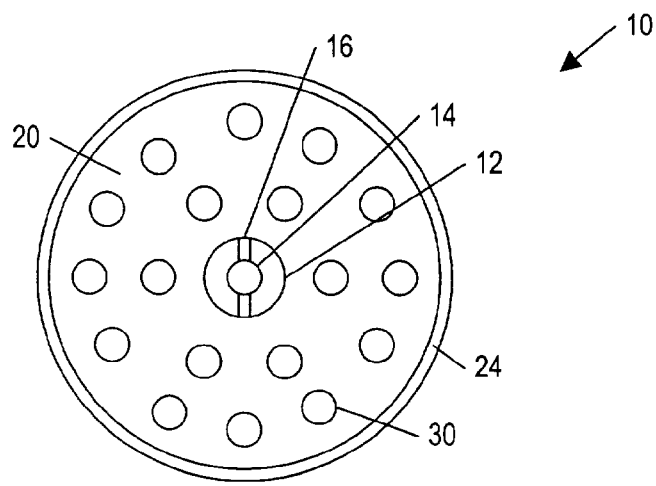
FIG. 1 depicts a top view of an embodiment of a brush holder.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

The present invention relates to a brush assembly for cleaning a semiconductor wafer. The brush assembly may be used to clean a semiconductor wafer after the wafer has been planarized in a Chemical-Mechanical Polishing (CMP) process. More particularly, the brush assembly may be used to scrub away slurry particles that remain on the surface of a semiconductor wafer after the wafer has been treated in a CMP process.

A brush holder 10 for cleaning a semiconductor wafer is depicted in FIG. 1. Brush holder 10 is preferably adapted to receive a brush for scrubbing one or more semiconductor wafers. Brush holder 10 is preferably made of plastic. In one embodiment, brush holder 10 is made of natural Delrin. Brush holder 10 preferably includes a connection stud 12 for attaching brush holder 10 to a polishing machine scrubber. The connection stud 12 preferably has a substantially cylindrical shape, although it may have other shapes such as that of a rectangular or triangular prism. The connection stud 12 preferably includes an axial borehole 14 for accepting a rotatable shaft 33 (shown in FIG. 5) and for passing a cleaning fluid from the scrubber to a brush. The connection stud 12 may include a substantially U-shaped slot 16 for providing a fixable connection with the polishing machine. Slot 16 may have a substantially circularly shaped end 19 (shown in FIG. 2) for receiving a connecting pin.

Brush holder 10 is preferably has a substantially circularly shaped edge and is preferably rotatable by the scrubber. One polishing apparatus that may be used in conjunction with the brush assembly of the present invention is the Speedfam model CMP-5, commercially available from Speedfam Corporation of Des Plaines, Ill. The brush assembly may also be used with an Auriga polisher. U.S. Pat. No. 5,498,199 relates to an apparatus for polishing semiconductor wafers and is incorporated by reference as if fully set forth herein.

Figure 2:
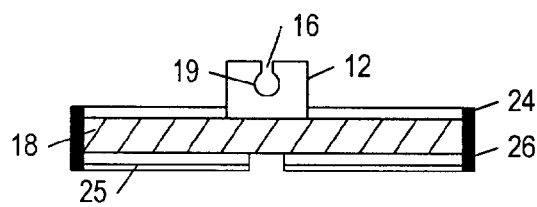
FIG. 2 depicts a cross sectional side view of the brush holder of FIG. 1.
Figure 3:
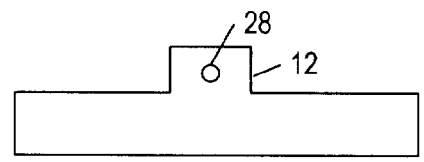
FIG. 3 depicts a side view of the brush holder of FIG. 1.
Figure 4:
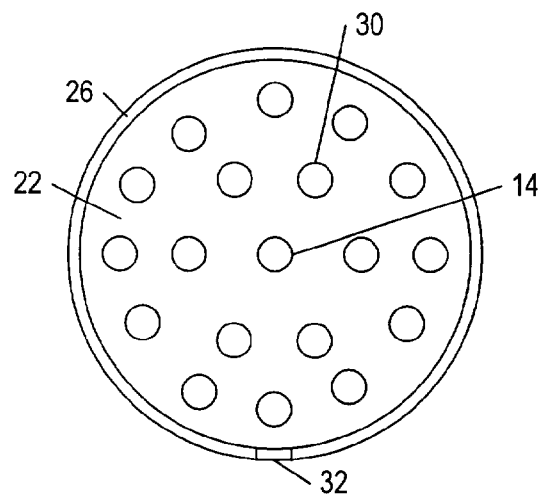
FIG. 4 depicts a bottom view of the brush holder of FIG. 1.

Side views of an embodiment of brush holder 10 are illustrated in FIG. 2 and FIG. 3 and FIG. 4 is a bottom view. Referring to FIGS. 1–4 collectively, connection stud 12 preferably extends from base 18, which includes an upper surface 20 and a lower surface 22. Base 18 may serve as a "dam" to temporarily hold cleaning fluid that is passed to the brush. The upper surface of the base preferably has a raised ridge 24 about its outer edge to contain cleaning fluid within the outer edge. Connection stud 12 may further include one or more openings 28 disposed on its outer surface that communicate with borehole 14. Opening(s) 28 may serve to distribute cleaning fluid about the upper surface 20 of base 18. Base 18 preferably includes a plurality of openings 30 that extend between the upper 20 and lower 22 surfaces of base 18. The openings 30 may serve to pass cleaning fluid to the brush during polishing. The openings 30 may be disposed in one or more rows about the circumference of base 18 and are preferably sized to allow passage of a predetermined amount of cleaning fluid to the brush during polishing.

A bottom view of an embodiment of brush holder 10 is illustrated in FIG. 4. The bottom surface 22 of brush holder 10 preferably includes a raised receiving lip 26 disposed thereon. Receiving lip 26 is preferably adapted to form a fixable engagement with the brush. An aperture 32 may be formed in the receiving lip 26 to facilitate orientation of the brush during assembly of the brush and brush holder 10.

Figure 5:
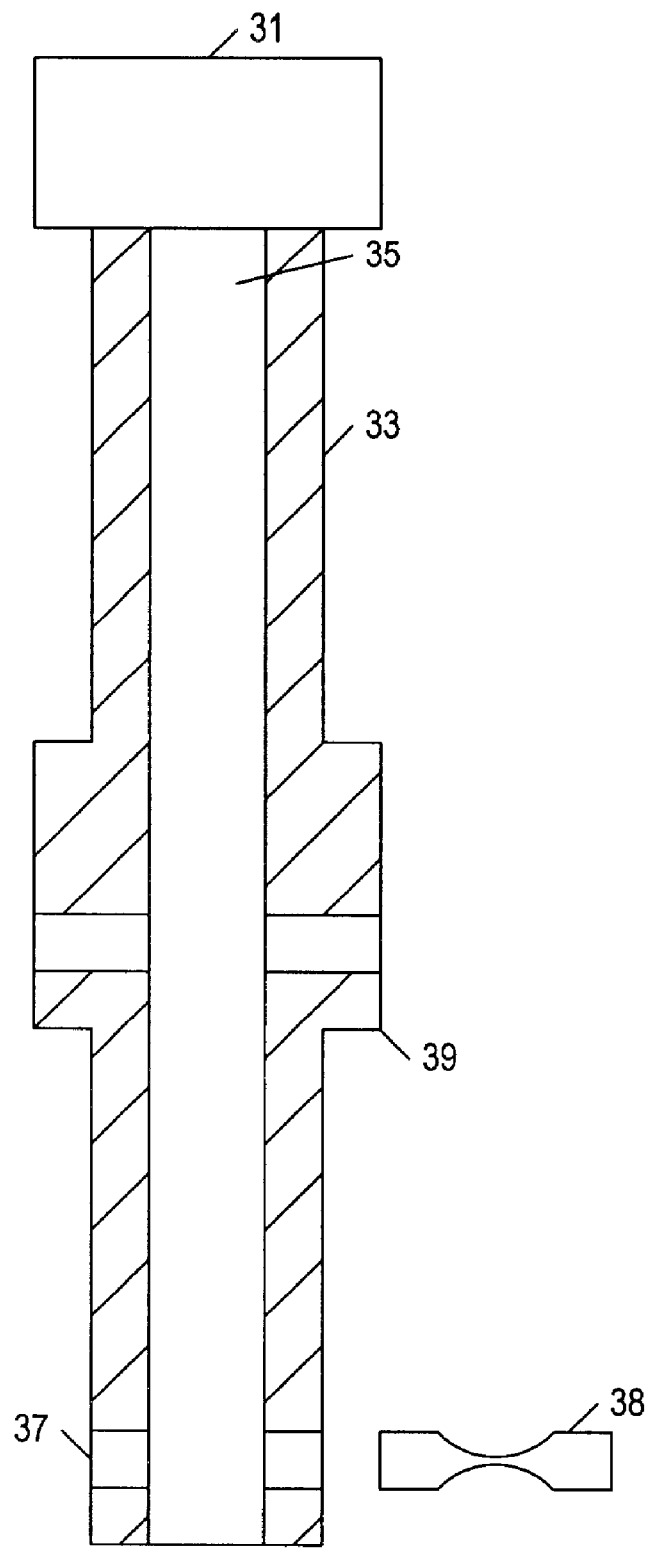
FIG. 5 depicts a cross sectional view of an embodiment of a scrubber shaft.

FIG. 5 illustrates an embodiment of a shaft 33 for connecting brush holder 10 to a scrubber 31. The shaft 33 is preferably hollow such that a conduit 35 is formed therein. Shaft 33 is preferably rotatable and capable of delivering cleaning fluid to the brush through conduit 35. Shaft 33 may be connected to scrubber 31 via a rotatable union at the upper end of the shaft. Shaft 33 may include a borehole 37 for receiving connecting pin 38. Connecting pin 38 is preferably sized to be received within end 19 such that a snap-fit engagement can be formed between shaft 33 and brush holder 10. After connecting pin 38 is inserted within borehole 37, the shaft 33 is preferably inserted into borehole 14 and connecting pin 38 is preferably pressed into slot 16 until it comes to rest within end 19. The width of the U-shaped slot 16 proximate its upper end is preferably slightly less than the diameter of connecting pin 38 to allow connecting pin 38 to be snapped into a fixable engagement within end 19. Connecting pin 38 preferably includes a middle section having a reduced diameter to facilitate the passage of fluid through conduit 35 proximate connecting pin 38. Of course ant other suitable method may be employed to connect shaft 33 to connection stud 12. Shaft 33 preferably includes a section 39 having an enlarged diameter that serves as a mechanical stop. The lower portion of section 39 may contact a bearing (not shown).

Figure 6:
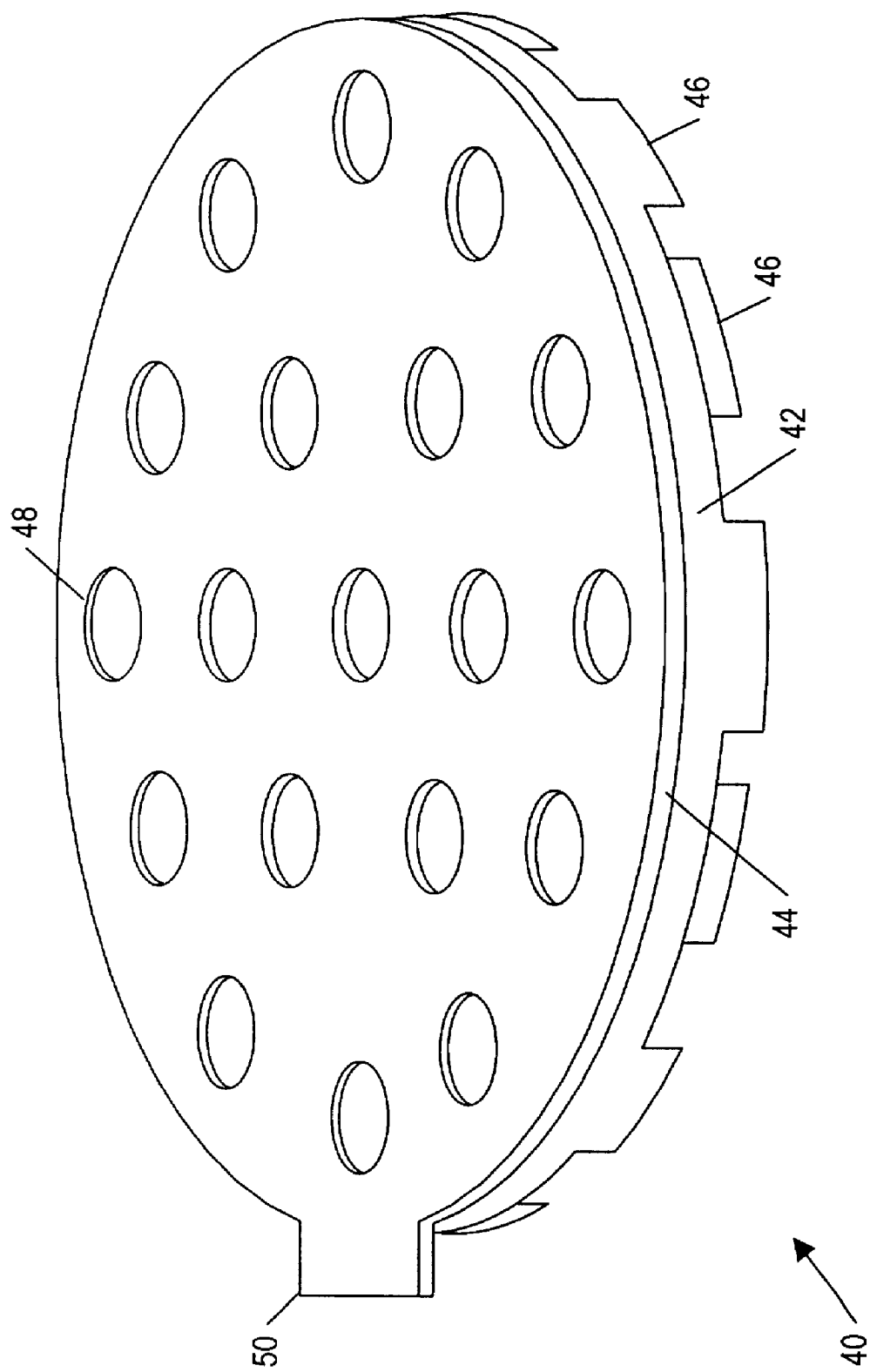
FIG. 6 depicts a top perspective view of an embodiment of a brush including a backing plate.

FIG. 6 illustrates a top perspective view of a brush 40 for scrubbing semiconductor wafers. Brush 40 preferably includes a substantially flexible material 42 for contacting the semiconductor wafer. The substantially flexible material 42 may be any suitable material for polishing a semiconductor wafer including, for example, foam and/or plastic. In one embodiment, the substantially flexible material 42 is polyvinyl acetal foam. Brush 40 preferably is attached to a backing plate 44 that may serve to connect brush 40 with brush holder 10. Brush 40 may be glued to backing plate 44 with, for example, an epoxy that maintains its adhesive capability in the presence of water and/or cleaning fluids having relatively basic or acidic pH values. Flexible material 42 preferably includes a plurality of protrusions 46 for engaging the semiconductor wafer. Protrusions 46 may be substantially compressible such that the height of protrusions 46 changes when brush 40 is pressed against a semiconductor wafer. Protrusions 46 are preferably arranged on brush 40 in a pattern that matches the pattern of openings 30 disposed on brush holder 10. Backing plate 44 preferably contains a plurality of openings 48 arranged in a pattern that matches the pattern of openings 30 on brush holder 10 and the pattern of protrusions 46 on brush 40. In this manner, cleaning fluid may be passed from the upper surface 20 through openings 30 and 48 to permeate the brush at locations proximate the protrusions 46.

Figure 7:
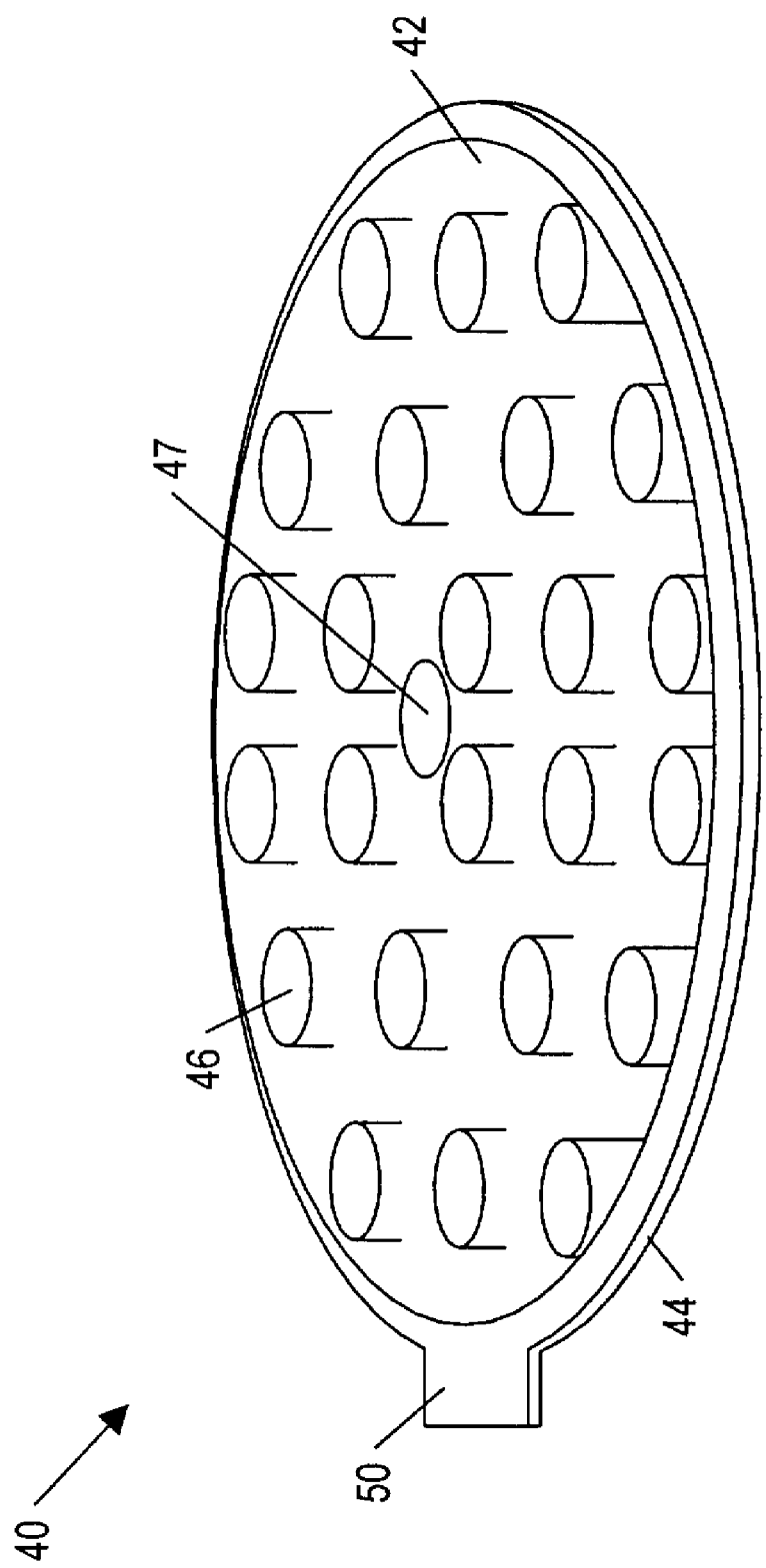
FIG. 7 depicts a bottom perspective view of the brush of FIG. 6.

FIG. 7 illustrates a bottom perspective view of brush 40. In an embodiment, brush 40 may include a central opening 47 that extends through flexible material 42. Central opening 47 preferably communicates with axial borehole 14. In this manner, cleaning fluid may be passed directly from brush 40 to a semiconductor wafer without first having to diffuse through the flexible material 42 of brush 40. In one embodiment, a spray of cleaning fluid may be directed through central opening 47 to a semiconductor wafer as brush 40 is removed from the semiconductor wafer. The spray of cleaning fluid preferably imparts a pressure of between about 20 psig and about 30 psig, and more preferably about 25 psig against the semiconductor wafer. It is believed that surface tension between brush 40 and the semiconductor wafer tends to cause particles to be transferred from brush 40 to the semiconductor wafer when brush 40 is removed from the semiconductor wafer in conventional processes. The spray of cleaning fluid directly against the wafer surface preferably reduces the surface tension to inhibit the transfer of particles from brush 40 to the wafer during removal of brush 40 from the wafer. Furthermore, cleaning fluid may be spray over the wafer when the brush 40 is a short distance above the wafer to further wash particles from the wafer.

Another aspect of opening 47 and conduit 35 is that the flow rate of cleaning fluid may be changed during cleaning. Also, the composition of the cleaning fluid may be instantaneously changed during cleaning without stopping rotation of brush 40. Opening 47 and conduit 35 also allow more efficient use of cleaning fluid since cleaning fluid does not fly off backing plate 44 when distributed through conduit 35 and opening 47.

Figure 8:
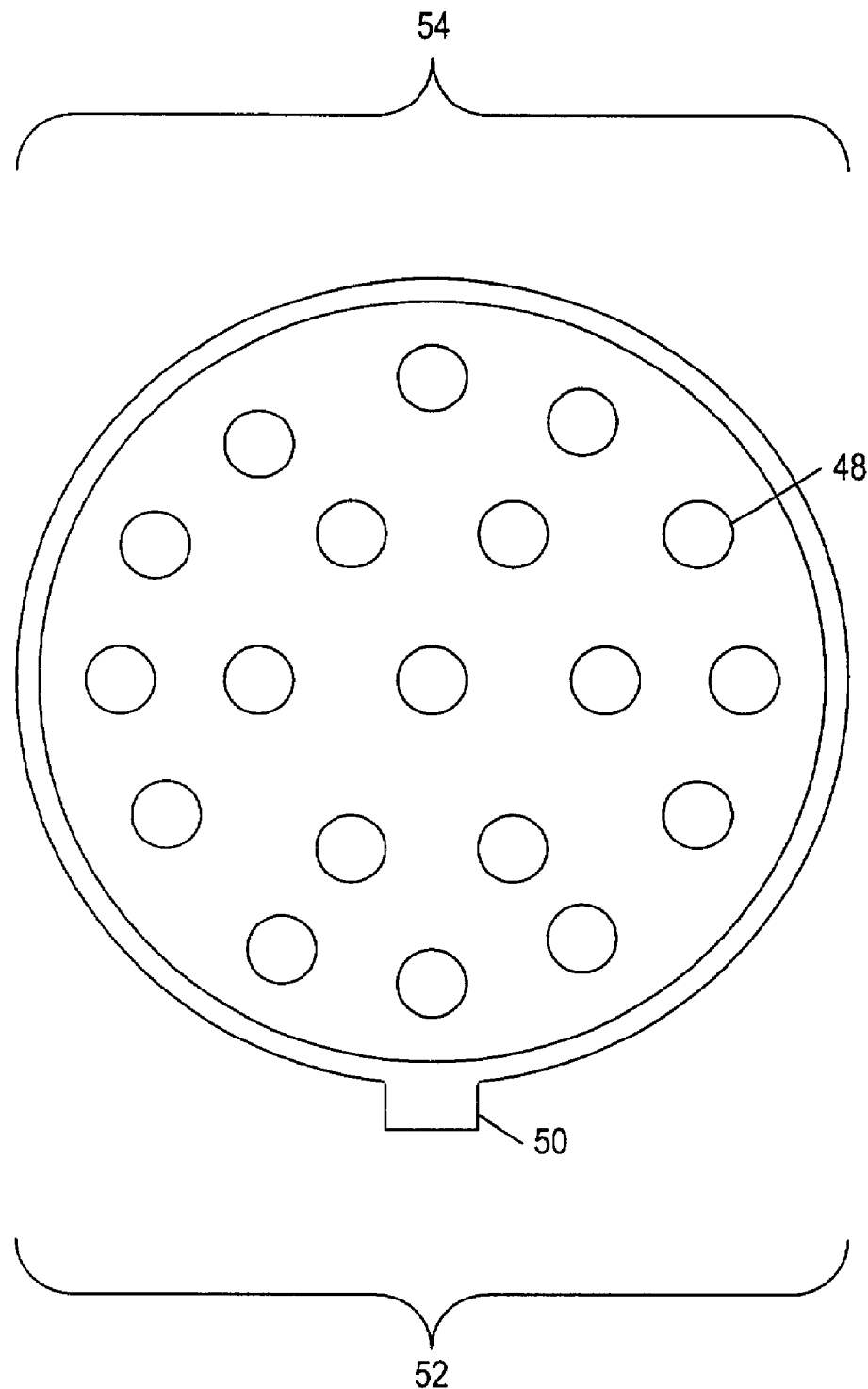
FIG. 8 depicts a bottom view of an embodiment of a brush including a backing plate

FIG. 8 illustrates a top view of an embodiment of backing plate 44 for connecting the brush 40 to brush holder 10. An opening 49 is included for communicating with borehole 14, conduit 35 and opening 47 to allow for the passage of cleaning fluid. Backing plate 44 is preferably made of plastic. In an embodiment, backing plate 44 is made of polyvinyl chloride. Backing plate 44 is preferably shaped to fit within receiving lip 26 and is preferably sized to permit a "snap-fit engagement" between brush 40 and brush holder 10. As described herein, "snap-fit engagement" is taken to mean a fixable mechanical engagement that is achievable by pressing together two or more components. The snap-fit engagement may be achieved by dimensioning the outer edges of backing plate 44 such that backing plate 44 has a slightly larger width or diameter than that of receiving lip 26 such that an interference fit can be formed. In an embodiment, receiving lip 26 is tapered such that the cross sectional area of the cavity formed on lower surface 22 increases in a direction toward lower surface 22. In this manner, backing plate 44 could be pressed against brush holder 10 with sufficient force to overcome the friction between the top of receiving lip 26 and backing plate 44, thereby causing backing plate 44 to rest deeper within the cavity where the cavity formed by receiving lip 26 has a slightly greater diameter.

In an alternate embodiment, the top portion of the receiving lip 26 contains an inwardly-disposed lip portion 25

(shown in FIG. 2) for maintaining brush 40 within brush holder 10. The inwardly-disposed lip portion 25 extends in a radially inward direction toward borehole 14. In an embodiment, the inwardly-disposed lip portion 25 is dimensioned such that it is barely observable by the human eye. Brush 40 is preferably pressed into engagement with brush holder 10 such that the outer edge of backing plate 44 fits between the inwardly-disposed lip portion 25 and the bottom surface 22.

Backing plate 44 preferably comprises an alignment portion 50 that extends from its outer edge. Alignment portion 50 is preferably sized to fit within aperture 32 of brush holder 10. Alignment portion 50 is preferably disposed on backing plate 44 at a predetermined location such that placing alignment portion 50 within aperture 32 causes the openings 30 in brush holder 10 and the openings 48 in backing plate 44 to be properly aligned. To insert backing plate 44 within the cavity formed by receiving lip 26, alignment portion 50 is preferably first placed within aperture 32. Backing plate 44 may be partially disposed within receiving lip 26 by positioning backing plate 44 at an angle such that a first edge portion 52 of the backing plate proximate alignment portion 50 is inserted within receiving lip 26, while a second edge portion 54 opposite the first edge portion 52 remains outside of the cavity formed by receiving lip 26. Once the first edge portion 52 is positioned within receiving lip 26 at a location that is preferably between inwardly-disposed lip portion 25 and bottom surface 22, the second edge portion 54 may be snapped into receiving lip 26 to form a snap-fit engagement between brush 40 and brush holder 10. To remove backing plate 44 from brush holder 10, pressure may be applied to alignment portion 50 in a direction away from bottom surface 22. In this manner, first edge portion 52 may be removed from receiving lip 26, and then second edge portion 54 may be removed from the receiving lip 26 to separate brush 40 and brush holder 10.

Figure 9:
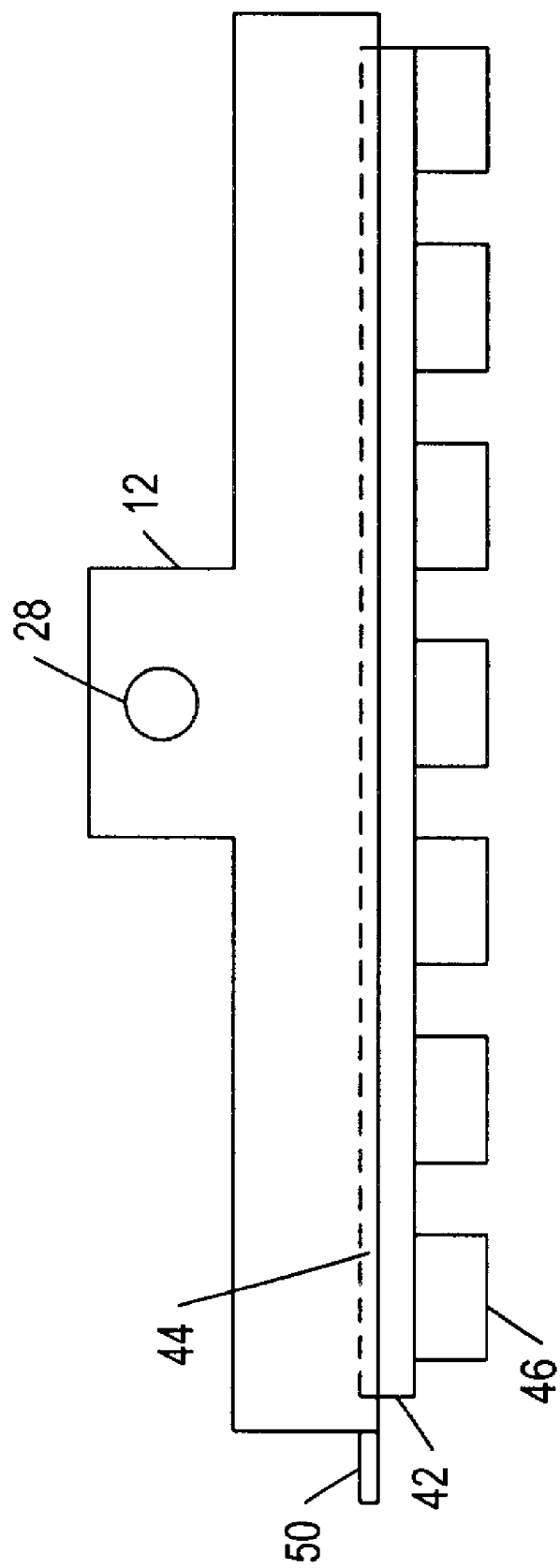
FIG. 9 depicts a side view of an embodiment of a brush assembly including a brush disposed within a brush holder.

A side view of an assembled brush 40 and brush holder 10 is depicted in FIG. 9. The brush assembly of the present invention preferably allows that brush 40 be replaced in a time of less than about 2 minutes, and more preferably about 1 minute or less. Backing plate 44 and brush holder 10 may form a mechanical snap-fit engagement together to allow brush 40 to be used in conjunction with cleaning agents (e.g., ammonium hydroxide) that tend to damage the adhesive coupons used in some conventional brush assemblies.

During operation, brush 40 is preferably pressed against the semiconductor wafer at a pressure between about 30 psig and about 60 psig. Brush 40 is preferably rotated by a scrubber at greater than 200 rpm. Brush 40 is preferably applied to the semiconductor wafer for less than about 15 seconds. In one embodiment, brush 40 contacts the semiconductor wafer for about 8 seconds. The cleaning fluid distributed from brush holder 10 to the surface of brush 40 may be water, an aqueous solution such as ammonium hydroxide, or other cleaning agents suitable for contacting a semiconductor wafer. Ammonium hydroxide is generally preferred as a cleaning agent since it may act as a surfactant to facilitate removal of slurry particles from the surface of a semiconductor wafer. Ammonium hydroxide may also electrically stabilize charged particles on the surface of the wafer to allow such particles to be removed more easily. Moreover, the presence of ammonium hydroxide on brush 40 may clean brush 40, thereby reducing the frequency with which brush 40 must be replaced. Brush 40 preferably cleans the wafer so that it contains less than 100 particles having a diameter of 0.2 microns or greater.

Figure 10:
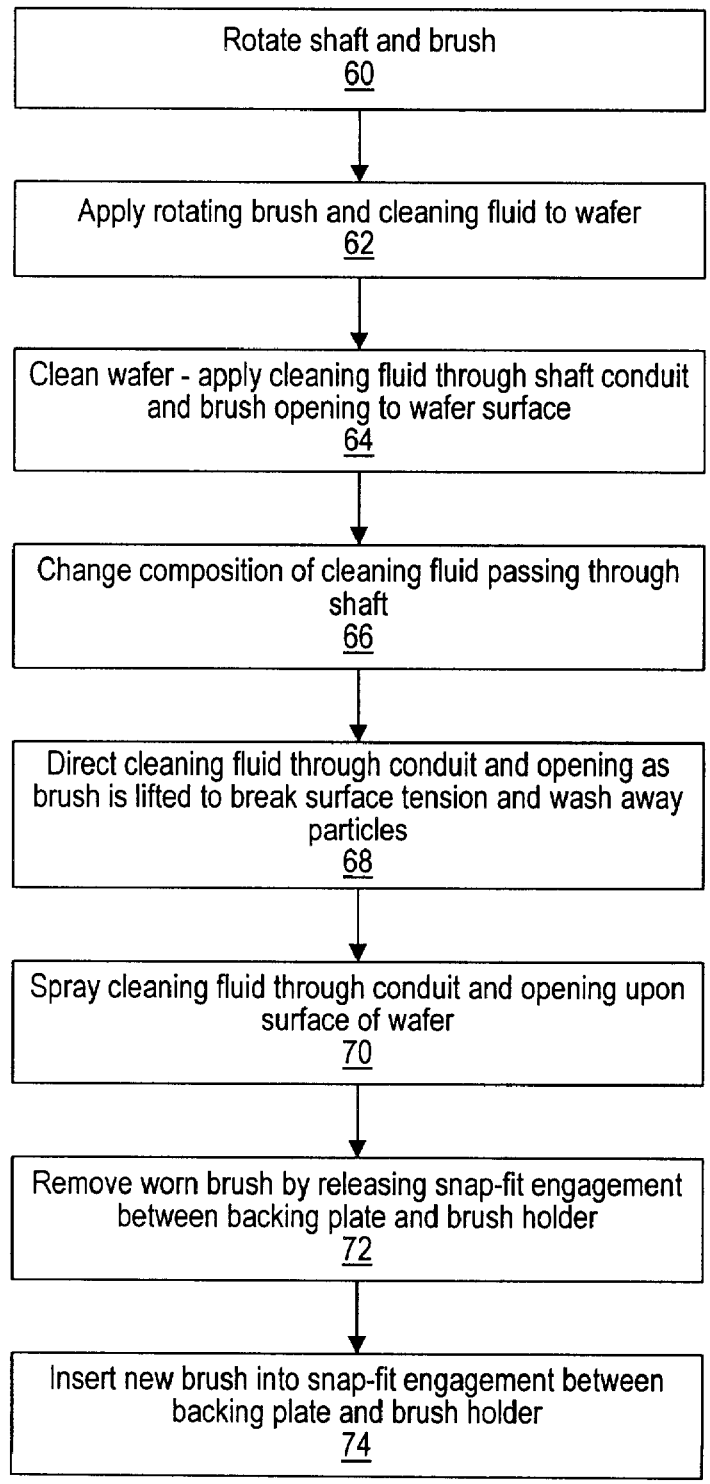
FIG. 10 depicts a method according to one embodiment for cleaning a semiconductor wafer.

FIG. 10 illustrates a method according to one embodiment of the present invention for cleaning a semiconductor wafer. The method comprises rotating a shaft connected to brush to rotate the brush, as indicated at step 60. The rotating brush and a cleaning fluid are applied to the surface of the semiconductor wafer for cleaning the surface of the semiconductor wafer, as indicated at step 62. The wafer is cleaned and cleaning fluid may be applied through the shaft conduit and brush opening to the wafer surface, as indicated at step 64. The composition of the cleaning fluid may also be changed during cleaning, as indicated at step 66. For example, the cleaning fluid composition may be changed from ammonium hydroxide to water or from water to ammonium hydroxide. Also, the flow rate of the cleaning fluid may be changed. Brush rotation does not have to be stopped to effect these changes. Upon completion of the cleaning, cleaning fluid is directed through the conduit in the shaft and through the opening in the center of the brush to the surface of the semiconductor wafer, as indicated at step 68. This application of cleaning fluid breaks up the surface tension to prevent particles from being pulled from brush pores when the brush is lifted. The brush is then lifted from the surface of the semiconductor wafer as cleaning fluid is directed onto the surface of the semiconductor wafer. Then cleaning fluid may be sprayed upon the surface of the semiconductor wafer during and after the lifting by passing cleaning fluid through the conduit and the opening, as indicated at step 70. The method of the present invention also contemplates replacing the brush by releasing a backing plate from a snap-fit engagement with a brush holder and inserting a new brush and backing plate into the snap-fit engagement with the brush holder, as indicated at steps 72 and 74.

Further modifications and alternative embodiments of various aspects of the invention will be apparent to those skilled in the art in view of this description. Accordingly, this description is to be construed as illustrative only and is for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

What is claimed is:

1. An apparatus for cleaning a semiconductor wafer, comprising:

a semiconductor wafer brush holder comprising a base and a connection stud extending from the upper surface of said base;

a semiconductor wafer brush attached to the lower surface of said base, said semiconductor wafer brush comprising a substantially flexible foam or plastic material suitable for contacting the semiconductor wafer; and a shaft with a conduit formed therein, said shaft rotatably coupled to a scrubber device at an upper end and detachably coupled to said connection stud at a lower end, wherein said conduit is adapted for delivering a cleaning fluid to said semiconductor wafer brush.

2. The apparatus as recited in claim 1, wherein said connection stud includes an axial borehole disposed therein adapted to communicate with said shaft to deliver the cleaning fluid to said semiconductor wafer brush.

3. The apparatus as recited in claim 2, wherein said base and said semiconductor wafer brush each include an opening adapted to communicate with said borehole and said conduit to deliver the cleaning fluid to the surface of the semiconductor wafer.

4. The apparatus as recited in claim 3, wherein said conduit, said borehole, said base opening and said semiconductor wafer brush opening are adapted to spray cleaning fluid on the semiconductor wafer as said semiconductor wafer brush is lifted from the wafer.

5. The apparatus as recited in claim 4, wherein said cleaning fluid comprises water.

6. The apparatus as recited in claim 1, wherein said cleaning fluid comprises ammonium hydroxide.

7. The apparatus as recited in claim 1, wherein said connection stud comprises a slot and an axially disposed borehole, and wherein said shaft further comprises an opening at its lower end, wherein said opening is adapted to receive a pin for forming a snap-fit engagement with said slot.

8. The apparatus as recited in claim 7, wherein said pin has a smaller diameter at its middle than at its ends to facilitate the passage of said cleaning fluid through said conduit and said borehole.

9. The apparatus as recited in claim 1, wherein said semiconductor wafer brush is attached to a backing plate and wherein the lower surface of said semiconductor wafer brush holder includes a receiving lip adapted to form a snap-fit engagement with the outer edge of said backing plate.

10. An apparatus for cleaning a semiconductor wafer, comprising:
    a scrubber comprising rotating means;
    a shaft coupled to said scrubber at the upper end of said shaft, said shaft comprising a conduit disposed axially within said shaft;
    a semiconductor wafer brush assembly detachably coupled to the lower end of said shaft, wherein said rotating means is operable to rotate said shaft and said semiconductor wafer brush assembly, wherein said semiconductor wafer brush assembly includes a foam or plastic brush suitable for cleaning a semiconductor wafer, and wherein said conduit is adapted to dispense a cleaning fluid to said semiconductor wafer brush assembly.

11. The apparatus as recited in claim 10, wherein said semiconductor wafer brush assembly comprises an opening adapted to communicate with said conduit for dispensing said cleaning fluid to the surface of the semiconductor wafer.

12. An apparatus for cleaning a semiconductor wafer, comprising:
    a scrubber comprising rotating means;
    a shaft coupled to said scrubber at the upper end of said shaft, said shaft comprising a conduit disposed axially within said shaft;
    a brush holder coupled to the lower end of said shaft, said brush holder comprising a lower surface having a receiving lip; and
    a brush attached to a backing plate, wherein said receiving lip is adapted to form a snap-fit connection with said backing plate;
    wherein said rotating means is operable to rotate said shaft and said brush assembly, and wherein said conduit is adapted to dispense a cleaning fluid to said brush assembly.

13. The apparatus as recited in claim 12, wherein said brush, said backing plate, and said brush holder each comprise and opening adapted to communicate with said conduit for dispensing said cleaning fluid to the surface of the semiconductor wafer.

14. A method for cleaning a semiconductor wafer, comprising:
    rotating a shaft connected to a brush to rotate the brush;
    applying the rotating brush and a cleaning fluid to the surface of a semiconductor wafer;
    cleaning the surface of said semiconductor wafer with said rotating brush and said cleaning fluid;
    upon completion of said cleaning, directing cleaning fluid through a conduit in said shaft and through an opening in the center of said brush to the surface of the semiconductor wafer;
    lifting said brush from the surface of the semiconductor wafer during said directing; and
    spraying a fluid comprising water or a fluid comprising an aqueous solution upon the surface of the semiconductor wafer after said lifting by passing said fluid comprising water or said fluid comprising an aqueous solution through said conduit and said opening.

15. The method as recited in claim 14, further comprising applying ammonium hydroxide through said conduit and said opening during said cleaning.

16. The method as recited in claim 14, further comprising:
    passing cleaning fluid through said conduit and said opening to the surface of the semiconductor wafer during said cleaning; and
    changing the composition of the cleaning fluid during said cleaning without stopping rotation of the brush.

17. The method as recited in claim 14, further comprising:
    passing cleaning fluid through said conduit and said opening to the surface of the semiconductor wafer during said cleaning; and
    changing the composition of the cleaning fluid from ammonium hydroxide to water during said cleaning without stopping rotation of the brush.

18. The method as recited in claim 14, further comprising:
    passing cleaning fluid through said conduit and said opening to the surface of the semiconductor wafer during said cleaning; and
    changing the composition of the cleaning fluid from water to ammonium hydroxide during said cleaning without stopping rotation of the brush.

19. The method as recited in claim 14, further comprising replacing said brush by releasing a backing plate from a snap-fit engagement with a brush holder and inserting a new brush and backing plate into a snap-fit engagement with said bush holder.

20. The method as recited in claim 14, wherein said aqueous solution is ammonium hydroxide.

21. An apparatus for cleaning a semiconductor wafer, comprising:
    a holder comprising a base and a connection stud extending from the upper surface of said base;
    a pad attached to the lower surface of said base, said pad comprising a substantially flexible material suitable for contacting the semiconductor wafer;
    a shaft with a conduit formed therein, said shaft rotatably coupled to a scrubber device at an upper end and detachably coupled to said connection stud at a lower end, wherein said conduit is adapted for delivering a cleaning fluid to said pad.

22. An apparatus for cleaning a semiconductor wafer, comprising:

a brush holder comprising a base and a connection stud extending from the upper surface of said base;

a brush attached to the lower surface of said base, said brush comprising a substantially flexible material for contacting the semiconductor wafer; and a shaft with a conduit formed therein, said shaft rotatably coupled to a scrubber device at an upper end and coupled to said connection stud at a lower end, wherein said connection stud comprises a slot and an axially disposed borehole, and wherein said shaft further comprises an opening at its lower end, wherein said opening is adapted to receive a pin for forming a snap-fit engagement with said slot, and wherein said conduit is adapted for delivering a cleaning fluid to said brush.

23. An apparatus for cleaning a semiconductor wafer, comprising:

a brush holder comprising a base and a connection stud extending from the upper surface of said base;

a brush attached to the lower surface of said base, said brush comprising a substantially flexible material for contacting the semiconductor wafer, wherein said brush is attached to a backing plate and wherein the lower surface of said brush holder includes a receiving lip adapted to form a snap-fit engagement with the outer edge of said backing plate; and a shaft with a conduit formed therein, said shaft rotatably coupled to a scrubber device at an upper end and coupled to said connection stud at a lower end, wherein said conduit is adapted for delivering a cleaning fluid to said brush.

24. A method for cleaning a semiconductor wafer, comprising:

rotating a shaft connected to a brush to rotate the brush;

applying the rotating brush and a cleaning fluid to the surface of a semiconductor wafer;

cleaning the surface of said semiconductor wafer with said rotating brush and said cleaning fluid;

upon completion of said cleaning, directing said cleaning fluid through a conduit in said shaft and through an opening in the center of said brush to the surface of the semiconductor wafer;

lifting said brush from the surface of the semiconductor wafer during said directing; and spraying said cleaning fluid upon the surface of the semiconductor wafer after said lifting by passing said cleaning fluid through said conduit and said opening.

25. A method for cleaning a semiconductor wafer, comprising:

rotating a shaft connected to a brush to rotate the brush;

applying the rotating brush and a cleaning fluid to the surface of a semiconductor wafer;

cleaning the surface of said semiconductor wafer with said rotating brush and said cleaning fluid;

upon completion of said cleaning, directing cleaning fluid through a conduit in said shaft and through an opening in the center of said brush to the surface of the semiconductor wafer;

lifting said brush from the surface of the semiconductor wafer during said directing; and spraying cleaning fluid upon the surface of the semiconductor wafer after said lifting by passing cleaning fluid through said conduit and said opening; and replacing said brush by releasing a backing plate from a snap-fit engagement with a brush holder and inserting a new brush and backing plate into a snap-fit engagement with said brush holder.

26. An apparatus for cleaning a semiconductor wafer, comprising:

a brush holder comprising a base and a connection stud extending from the upper surface of said base;

a sponge-like brush attached to the lower surface of said base, said sponge-like brush comprising a substantially flexible material for contacting the semiconductor wafer; and a shaft with a conduit formed therein, said shaft rotatably coupled to a scrubber device at an upper end and detachably coupled to said connection stud at a lower end, wherein said conduit is adapted for delivering a cleaning fluid to said sponge-like brush.

27. An apparatus for cleaning a semiconductor wafer, comprising:

a scrubber comprising rotating means;

a shaft coupled to said scrubber at the upper end of said shaft, said shaft comprising a conduit disposed axially within said shaft;

a brush assembly detachably coupled to the lower end of said shaft, wherein said rotating means is operable to rotate said shaft and said brush assembly, wherein said brush assembly includes a sponge-like brush for cleaning a semiconductor wafer, and wherein said conduit is adapted to dispense a cleaning fluid to said brush assembly.

28. An apparatus for cleaning a semiconductor wafer, comprising:

a scrubber comprising rotating means;

a shaft coupled to said scrubber at the upper end of said shaft, said shaft comprising a conduit disposed axially within said shaft;

an assembly detachably coupled to the lower end of said shaft, wherein said rotating means is operable to rotate said shaft and said assembly, wherein said assembly includes a pad for cleaning a semiconductor wafer, and wherein said conduit is adapted to dispense a cleaning fluid to said brush assembly.

* * * * *